(12) United States Patent
Kim et al.

(10) Patent No.: US 12,313,943 B2
(45) Date of Patent: May 27, 2025

(54) DISPLAY DEVICE WITH SLIM CONTROL ASSEMBLY

(71) Applicant: SAMSUNG ELECTRONICS CO., LTD., Suwon-si (KR)

(72) Inventors: Moonyoung Kim, Suwon-si (KR); Jeongil Kang, Suwon-si (KR); Wonmyung Woo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 176 days.

(21) Appl. No.: 18/097,023

(22) Filed: Jan. 13, 2023

(65) Prior Publication Data

US 2023/0205021 A1    Jun. 29, 2023

Related U.S. Application Data

(63) Continuation of application No. PCT/KR2021/013599, filed on Oct. 5, 2021.

(30) Foreign Application Priority Data

Oct. 5, 2020   (KR) .......................... 10-2020-0128272

(51) Int. Cl.
*H05K 1/18* (2006.01)
*G02F 1/1333* (2006.01)
(Continued)

(52) U.S. Cl.
CPC ...... *G02F 1/1345* (2013.01); *G02F 1/133314* (2021.01); *H05K 1/0203* (2013.01);
(Continued)

(58) Field of Classification Search
CPC ............. G02F 1/1345; G02F 1/133314; G02F 1/133308; H05K 1/0203; H05K 1/0271;
(Continued)

(56) References Cited

U.S. PATENT DOCUMENTS 5,014,419 A  *  5/1991  Cray ....................... H01L 24/11
                                                     29/838
6,515,405 B1 *  2/2003  Kumasaka ............. H10N 30/40
                                                     310/345
(Continued)

FOREIGN PATENT DOCUMENTS

CN     208479685 U    2/2019
CN     111666783 A    9/2020
(Continued)

OTHER PUBLICATIONS

International Search Report and Written Opinion dated Jan. 6, 2022, issued by the International Searching Authority in International Application No. PCT/KR2021/013599 (PCT/ISA/220, 210, 237).
(Continued)

*Primary Examiner* — Jacob R Crum
(74) *Attorney, Agent, or Firm* — Sughrue Mion, PLLC

(57) ABSTRACT

A display device includes: a display panel; a chassis assembly accommodating the display panel; a rear cover surrounding at least a portion of the chassis assembly; and a control assembly provided between the chassis assembly and the rear cover and, wherein the control assembly includes: a single-side printed circuit board (PCB) including a circuit surface with a circuit pattern printed thereon, and an insulating surface, a circuit module provided on the circuit
(Continued)

surface, and a jumper connector including a first protruding portion passing through a first hole of the single-side PCB, a second protruding portion passing through a second hole of the single-side PCB.

14 Claims, 20 Drawing Sheets

(51) Int. Cl.
*G02F 1/1345* (2006.01)
*H05K 1/02* (2006.01)

(52) U.S. Cl.
CPC .......... *H05K 1/0271* (2013.01); *H05K 1/184* (2013.01); *H05K 2201/066* (2013.01); *H05K 2201/10136* (2013.01)

(58) Field of Classification Search
CPC ... H05K 2201/066; H05K 2201/10136; H05K 3/0061; H05K 3/284; H05K 2201/09872; H05K 2201/10363; H05K 3/222; H05K 1/184
See application file for complete search history.

(56) References Cited

U.S. PATENT DOCUMENTS

| | | | |
|---|---|---|---|
| 6,708,506 | B2 | 3/2004 | Lee |
| 7,391,616 | B2 | 6/2008 | Kim et al. |
| 7,714,954 | B2 | 5/2010 | Aoyagi et al. |
| 8,184,446 | B2 | 5/2012 | Jang |
| 8,542,493 | B2 | 9/2013 | Abe et al. |
| 8,735,735 | B2 | 5/2014 | Palm et al. |
| 10,349,517 | B2 | 7/2019 | Logan et al. |
| 10,660,207 | B2 | 5/2020 | Kusuyama |
| 2005/0018406 | A1 | 1/2005 | Harris |
| 2007/0279545 | A1* | 12/2007 | Jang ................. H05K 1/182 349/56 |
| 2008/0232052 | A1 | 9/2008 | Kim et al. |
| 2009/0145637 | A1 | 6/2009 | Kanouda et al. |
| 2009/0175019 | A1 | 7/2009 | Koyama et al. |
| 2012/0051017 | A1 | 3/2012 | Lee et al. |
| 2016/0186944 | A1* | 6/2016 | Park ................. G02F 1/133308 362/97.1 |
| 2017/0042032 | A1* | 2/2017 | Joo ................. G02F 1/133308 |

FOREIGN PATENT DOCUMENTS

| | | |
|---|---|---|
| JP | 2011-28109 A | 2/2011 |
| JP | 2012-14967 A | 1/2012 |
| JP | 2012-49527 A | 3/2012 |
| JP | 5429334 B2 | 2/2014 |
| JP | 2015-49415 A | 3/2015 |
| KR | 10-0163868 B1 | 12/1998 |
| KR | 10-0461640 B1 | 12/2004 |
| KR | 10-2006-0031906 A | 4/2006 |
| KR | 10-0592284 B1 | 6/2006 |
| KR | 10-2006-0119257 A | 11/2006 |
| KR | 10-0669327 B1 | 1/2007 |
| KR | 10-2007-0115189 A | 12/2007 |
| KR | 10-0850400 B1 | 8/2008 |
| KR | 10-2009-0060169 A | 6/2009 |
| KR | 10-0947183 B1 | 3/2010 |
| KR | 10-1026667 B1 | 4/2011 |
| KR | 10-1820791 B1 | 1/2018 |
| WO | 2018/168709 A1 | 9/2018 |

OTHER PUBLICATIONS

Communication issued Apr. 15, 2024 by the European Patent Office in European Patent Application No. 21877941.1.
Communication issued Jan. 25, 2024 by the European Patent Office in European Patent Application No. 21877941.1.
Communication dated Sep. 6, 2024, issued by the Korean Intellectual Property Office in Korean Patent Application No. 10-2020-0128272.

* cited by examiner

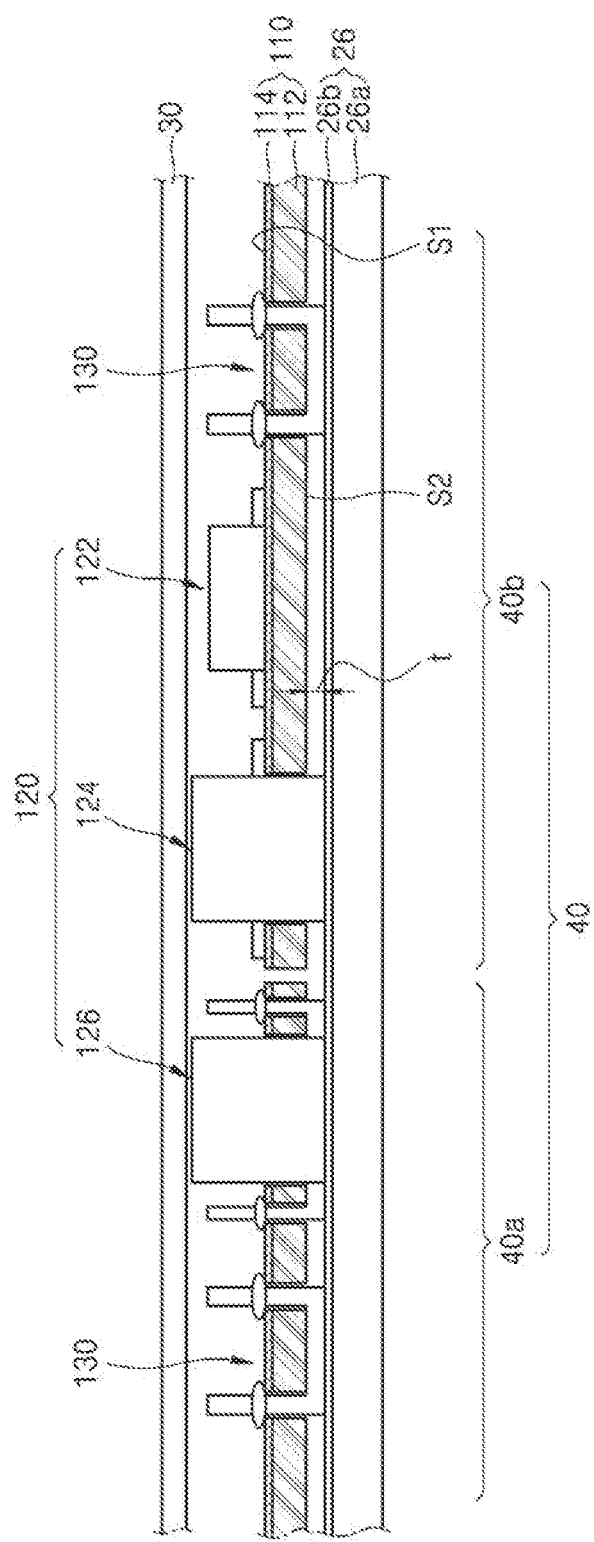

DISPLAY DEVICE WITH SLIM CONTROL ASSEMBLY

CROSS-REFERENCE TO RELATED APPLICATIONS

This application is a by-pass continuation application of International Application No. PCT/KR2021/013599, filed on Oct. 5, 2021, which claims priority to Korean Patent Application No. 10-2020-0128272, filed on Oct. 5, 2020 in the Korean Intellectual Property Office, the disclosures of which are incorporated by reference herein in their entireties.

BACKGROUND

1. Field

The present disclosure relates to a display device, and more particularly, to a slim display device.

2. Description of Related Art

A display device refers to an output device that converts electrical information into visual information and displays the visual information to a user. The display device may include not only a television (TV) and a monitor, but also portable devices such as a laptop personal computer (PC), a smartphone, a tablet PC, etc.

The display device may include a self-emissive display panel such as an organic light-emitting diode (OLED) or a light-receiving display panel such as a liquid crystal display (LCD).

Meanwhile, many consumers place importance on the design of a display device, and thus the tendency is for display devices to become thinner. Various schemes to implement a slim display device have been conceived. However, these schemes often require designing smaller circuits to reduce the size of the display device, which increases the cost of the display device.

SUMMARY

Provided is a display device including a slim control assembly.

In addition, provided is a display device using a component of a control assembly as a spacer.

According to an aspect of the disclosure, a display device includes: a display panel configured to display an image; a chassis assembly accommodating the display panel; a rear cover surrounding at least a portion of the chassis assembly; and a power source assembly provided between the chassis assembly and the rear cover, the power source assembly being configured to supply power to the display panel, wherein the power source assembly includes: a single-side printed circuit board (PCB) including a circuit surface facing the rear cover with a circuit pattern printed thereon, and an insulating surface facing the chassis assembly, and a circuit module including a first circuit module arranged on the circuit surface of the single-side PCB, and a second circuit module passing through a first hole of the single-side PCB.

The power source assembly further includes a jumper connector electrically connecting two points of the circuit pattern on the circuit surface, the jumper connector including a region provided on the insulating surface of the single-side PCB, and a protruding height of the jumper connector from the circuit surface may be less than or equal to a protruding height of the second circuit module from the circuit surface.

The jumper connector may include: a first protruding portion passing through a second hole of the single-side PCB and electrically connected to the circuit pattern; a second protruding portion passing through a third hole of the single-side PCB and electrically connected to the circuit pattern; and a flat portion provided on the insulating surface and connected to the first protruding portion and the second protruding portion, and the flat portion of the jumper connector contacts the chassis assembly.

The first protruding portion and the second protruding portion may be configured to apply a tensile force to the flat portion of the jumper connector.

The first protruding portion and the second protruding portion may be bent outward from the flat portion of the jumper connector.

At least one of the second hole or the third hole may have an oval cross-section.

A major-axis direction of the oval cross-section may be parallel to a longitudinal direction of the flat portion of the jumper connector.

A separating distance between the insulating surface of the single-side PCB and the chassis assembly may be less than or equal to about 1 mm.

The display device may further include a spacer supporting the single-side PCB in contact with at least one of the single-side PCB or the chassis assembly.

The spacer may include an elastic material.

The display device may further include a heat sink member contacting at least one of the single-side PCB or the circuit module.

The heat sink member may include a first region protruding from the insulating surface toward the chassis assembly through a fourth hole of the single-side PCB.

The display device may further include a holder-type spacer provided in an edge of the single-side PCB and configured to prevent the single-side PCB from being bent.

The display device may further include a sub power source assembly passing through a fifth hole of the single PCB, the chassis assembly may include a rear chassis, and a height of a region of the sub power source assembly protruding from the single-side PCB toward the rear chassis may be equal to a thickness of the jumper connector.

According to an aspect of the disclosure, a display device includes: a display panel configured to display an image; a chassis assembly accommodating the display panel; a rear cover surrounding at least a portion of the chassis assembly; and a control assembly provided between the chassis assembly and the rear cover and configured to control the display panel, wherein the control assembly includes: a single-side printed circuit board (PCB) including a circuit surface facing the rear cover with a circuit pattern printed thereon, and an insulating surface facing the chassis assembly, a circuit module provided on the circuit surface, and a jumper connector including a first protruding portion passing through a first hole of the single-side PCB and electrically connected to the circuit pattern, a second protruding portion passing through a second hole of the single-side PCB and electrically connected to the circuit pattern, and a flat portion provided on the insulating surface and connected to the first protruding portion and the second protruding portion.

DESCRIPTION OF DRAWINGS

The above and other aspects, features, and advantages of certain embodiments of the present disclosure will be more apparent from the following description taken in conjunction with the accompanying drawings, in which:

FIG. 16 illustrates a plurality of control assemblies according to an embodiment;

DETAILED DESCRIPTION

Figure 1:
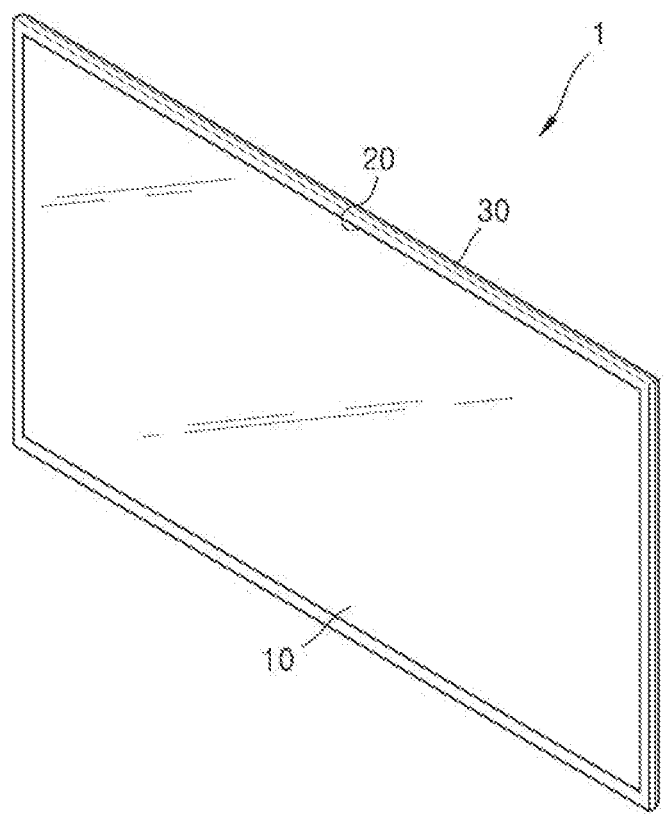
FIG. 1 illustrates an exterior of a display device, according to an embodiment.

Embodiments described herein and components shown in the drawings are example embodiments of the present disclosure, and there may be various modifications capable of replacing the embodiments and drawings herein at the time of filing of the present application.

The same reference numeral or symbol presented in each drawing herein represents a part or component that performs substantially the same function. The size and shape of parts or components shown in the drawings may be exaggerated for clarity.

The term used herein is used to describe one or more embodiments of the present disclosure, and is not intended to limit and/or restrict the present disclosure. Singular forms include plural forms unless apparently indicated otherwise contextually.

It should be understood that the term "include", "have", or the like used herein is to indicate the presence of features, numbers, steps, operations, elements, parts, or a combination thereof described in the specifications, and does not preclude the presence or addition of one or more other features, numbers, steps, operations, elements, parts, or a combination thereof.

Terms including ordinal numbers such as "first", "second", etc., used herein may be used to describe various components, but the components are not limited by the terms, and the terms are used to distinguish a component from other components. For example, a first component may be referred to as a second component without departing from the scope of the present disclosure, and similarly, the second component may be referred to as the first component.

Herein below, one or more embodiments of the present disclosure will be described in detail with reference to the accompanying drawings.

Figure 2:
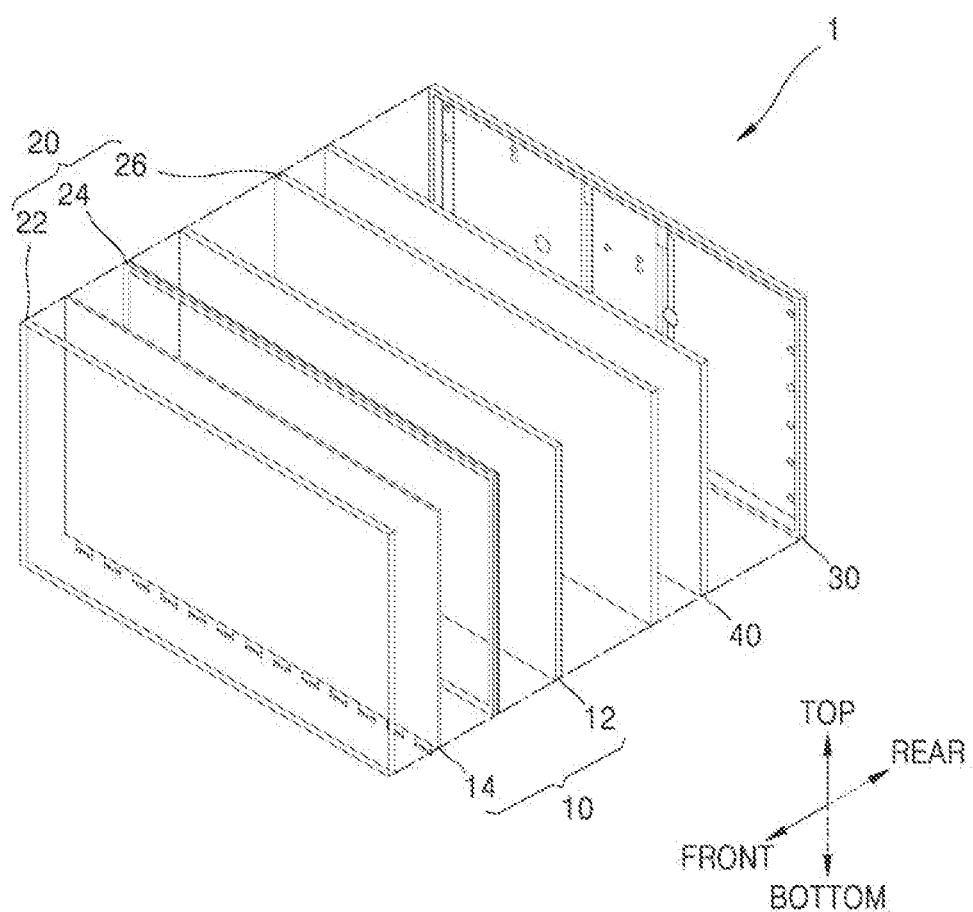
FIG. 2 is an exploded perspective view showing a display device, according to an embodiment.

FIG. 1 illustrates an exterior of a display device 1 according to one or more embodiments, and FIG. 2 is an exploded perspective view of the display device 1 according to one or more embodiments.

Referring to FIG. 1, the display device 1 may process an image signal received from an external source and visually display a processed image signal. Although the display device 1 is a television (TV) as an example, the present disclosure is not limited thereto. For example, the display device 1 may be implemented in various forms such as a monitor, a portable multimedia device, a portable communication device, a portable calculation device, etc. A form of the display device 1 may be any device known to one of ordinary skill in the art that visually displays an image.

Moreover, the display device 1 may be a large format display (LFD) installed outdoors, such as on the roof of a building, at a bus stop, or any other suitable structure. Herein, the outdoors are not limited to the outside, where according to one or more embodiments, the display device may be installed indoors such as in subway stations, shopping malls, movie theaters, offices, stores, etc., or any other indoor environment where many people may come and go.

The display device 1 may receive a video signal and an audio signal from various content sources and output video and audio corresponding to the video signal and the audio signal. For example, the display device 1 may receive TV broadcasting content through a broadcast receiving antenna or a wired cable, receive content from a content playback device, or receive content from a content providing server of a content provider.

The display device 1 may include a display panel 10 that displays an image and may be a flat panel display device as shown in FIG. 1. The display device 1 may be a curved display device in which the display panel 10 is bent or may be a bendable display device. For example, the display panel 10 may be deformed from a flat surface to a curved surface, or from a curved surface to a flat surface, or a curvature of the curved surface may change.

The display device 1 may include the display panel 10 that is configured to display an image, a chassis assembly 20 that accommodates and supports the display panel 10, and a rear cover 30 that surrounds the chassis assembly 20 to protect the chassis assembly 20. The display device 1 may further include a leg for supporting the display device 1 on an installation surface.

The display device 1 may be implemented as various types of display structures configured to display image. For example, the display device 1 may include a liquid crystal display (LCD) panel, a light-emitting diode (LED) panel, or an organic LED (OLED) panel.

Hereinbelow, a display device including an LCD panel will be described as one or more examples of the display device 1.

Referring to FIG. 2, the display panel 10 may include a backlight unit 12 that emits surface light forward and a liquid crystal panel 14 that blocks or passes there through the light emitted from the backlight unit 12.

The backlight unit 12 may include a point light source that emits monochromatic light or white light. The backlight unit 12 may be configured to convert the light emitted from a point light source into uniform surface light, refract, reflect, and scatter the light. For example, the backlight unit 12 may include a light source that emits monochromatic light or white light, a light guide plate that receives light from the light source and diffuses the incident light, a reflective sheet that reflects the light emitted from a rear surface of the light guide plate, and an optical sheet that refracts and scatters the light emitted from a front surface of the light guide plate.

As such, the backlight unit 12 may emit the uniform surface light toward the liquid crystal panel 14 by refracting, reflecting, and scattering the light emitted from the light source.

The liquid crystal panel 14 may be provided in front of the backlight unit 12 and block or pass there through the light emitted from the backlight unit 12 to form an image.

The liquid crystal panel 14 may include a plurality of pixels. The plurality of pixels included in the liquid crystal panel 14 may each independently block or pass there through the light of the backlight unit 12. The light passing through the plurality of pixels may form an image.

In some embodiments, the liquid crystal panel 14 may include a thin film transistor (TFT) substrate, a color filter substrate coupled to face the TFT substrate, and liquid crystals injected between the TFT substrate and the color filter substrate. The TFT substrate may be a transparent substrate in which a TFT that is a switching element is formed in a matrix form, and the color filter substrate may be a transparent substrate in which RGB color pixels, which are color pixels expressing a certain color, may be formed by a thin film process.

The display device 1 may include the chassis assembly 20 accommodating and supporting the display panel 10. In some embodiments, the chassis assembly 20 may include a front chassis 22, a middle mold 24, and a rear chassis 26.

The front chassis 22 may include an opening for exposing the liquid crystal panel 14. The middle mold 24 may include a middle mold side portion and an intermediate support portion that protrudes inwardly from the middle mold side portion to support the liquid crystal panel 14 and maintain a gap there between.

The rear chassis 26 may support the backlight unit 12. On the rear chassis 26, various components of the display device 1 such as the front chassis 22, the middle mold 24, etc., may be fixed and supported.

On a top surface of the rear chassis 26, a PCB of the backlight unit 12 may be mounted. The rear chassis 26 may serve to dissipate heat generated in the light source of the backlight unit 12 outside. The heat generated in the light source of the backlight unit 12 may be delivered to the rear chassis 26 through the PCB and may be dissipated in the rear chassis 26.

The rear chassis 26 may be formed of various metal materials such as aluminum, stainless steel having good thermal conductivity, or any other suitable metal known to one of ordinary skill in the art. In other examples, the rear chassis 26 may be formed of a plastic material such as acrylonitrile butadiene styrene (ABS) resin, or any other suitable plastic known to one of ordinary skill in the art.

At least one of the front chassis 22, the middle mold 24, and the rear chassis 26 may be omitted or formed integrally. The display device 1 may further include the rear cover 30 surrounding the chassis assembly 20 to protect the chassis assembly 20.

The display device 1 may further include a control assembly 40 arranged between the chassis assembly 20 and the rear cover 30 to control the display panel 10. In some embodiments, the control assembly 40 may include a control circuit that controls operations of the backlight unit 12 and the liquid crystal panel 14 and a power source circuit that supplies power to the backlight unit 12 and the liquid crystal panel 14.

The control circuit may process image data received from an external content source, transmit image data to the liquid crystal panel 14, and transmit dimming data to the backlight unit 12. The power source circuit may supply power to the liquid crystal panel 14 and the backlight unit 12 such that the backlight unit 12 outputs surface light and the liquid crystal panel 14 blocks or passes there through the light of the backlight unit 12.

The control assembly 40 may be implemented with a PCB and various circuit modules mounted on the PCB. For example, a circuit module may include at least one of (i) a power source circuit that includes a capacitor, a coil, a resistor element, a processor, etc., and supplies power to the display panel 10 and (ii) a control circuit that includes a memory, a processor, etc., and supplies a control signal to the display panel 10. The power source circuit and the PCB may be referred to as a power source assembly.

To implement a slim display device, the thickness of the display panel 10 or the thickness of the control assembly 40 may be reduced. To reduce the thickness of the control assembly 40, a small circuit module may be used, increasing the cost of the circuit module. For a power module configured to efficiently delivering power with a certain volume, there is a limitation in reducing the volume. Thus, to implement the slim display device and achieve the significantly advantageous features resulting therefrom, it is necessary to enlarge a mounting area of a board while reducing the height of the control assembly 40.

The control assembly 40, according to some embodiments, may secure price competitiveness of the board by using a single-side PCB. Moreover, a slim display device may be implemented using a relative arrangement relationship between the circuit module and a jumper connector in the control assembly 40, and an arrangement relationship among the control assembly 40, the chassis assembly 20, and the rear cover 30.

Figure 3:
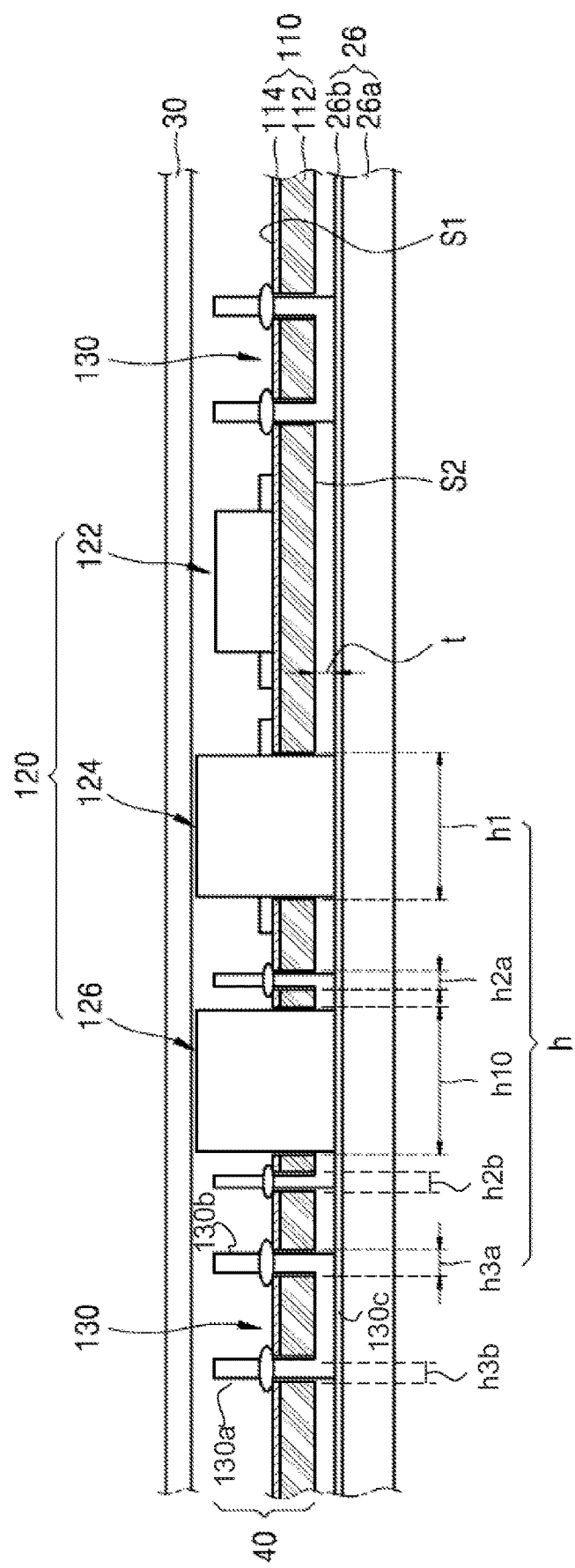
FIG. 3 illustrates a control assembly according to an embodiment.
Figure 4A:
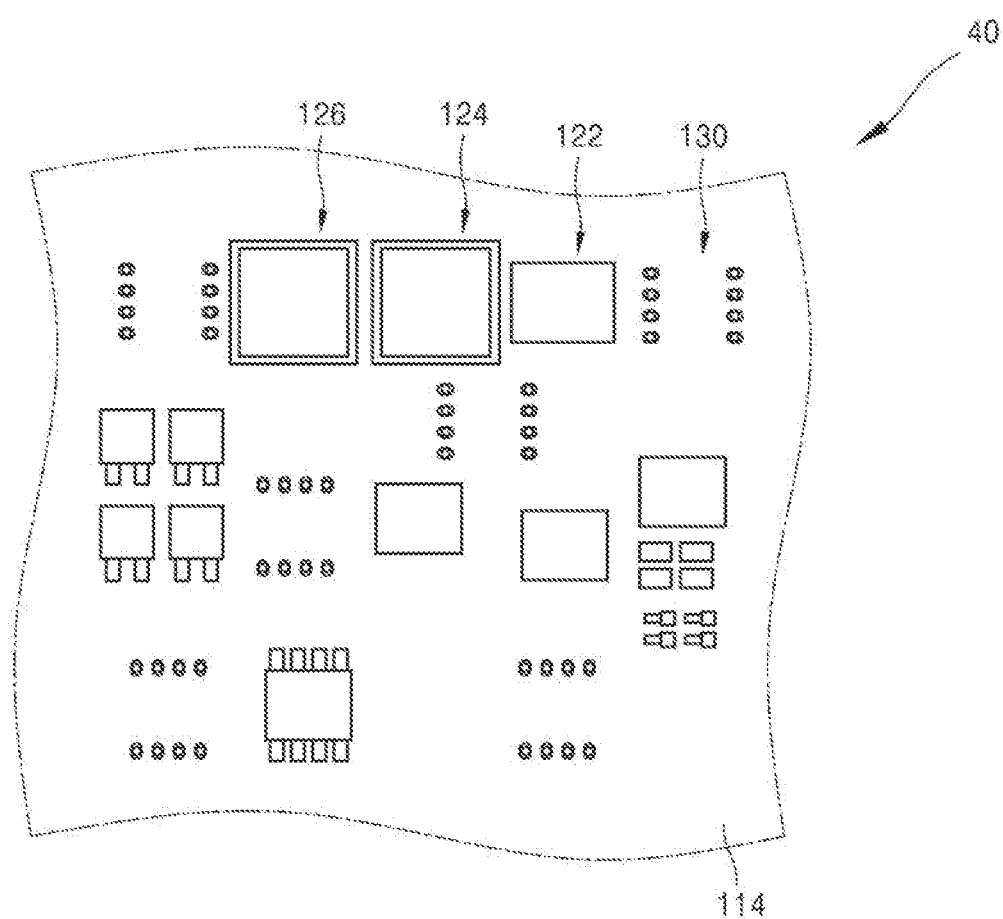
FIG. 4A illustrates circuit modules arranged on a circuit surface of a printed circuit board (PCB), according to an embodiment.
Figure 4B:
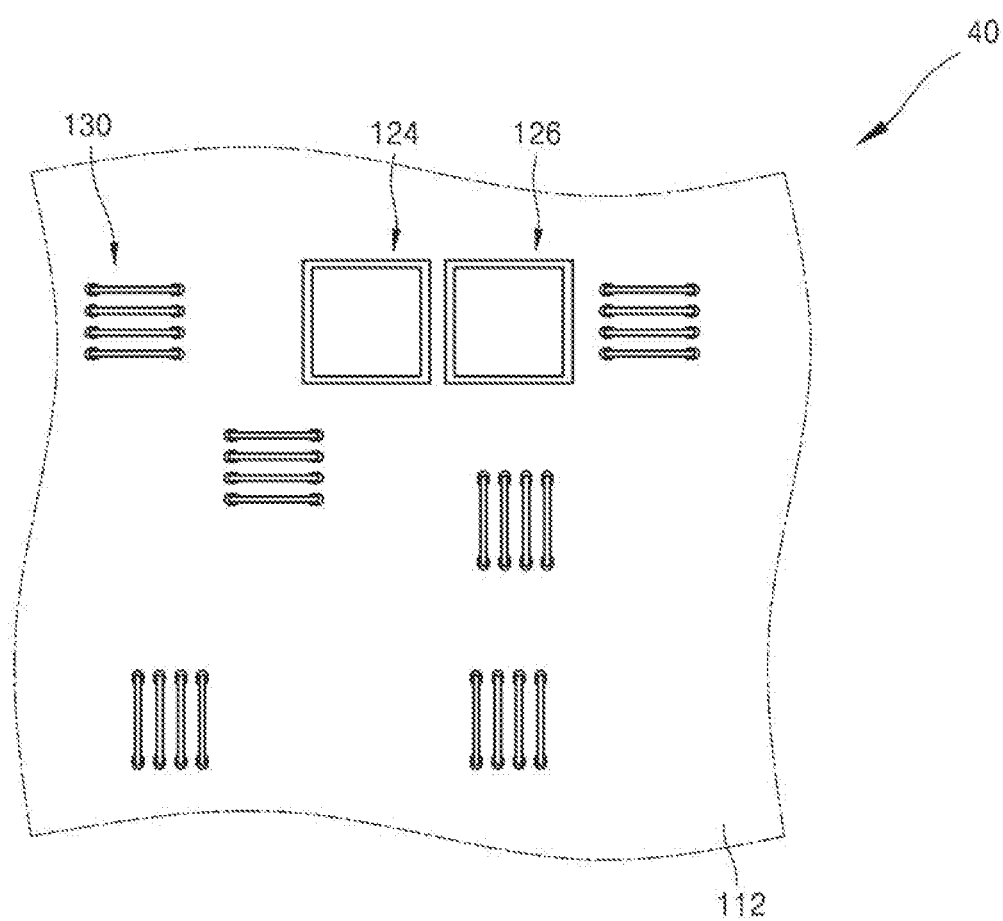
FIG. 4B illustrates a jumper connector arranged on an insulating surface of a PCB, according to an embodiment.

FIG. 3 illustrates a control assembly according to one or more embodiments, FIG. 4A illustrates circuit modules arranged on a circuit surface of a PCB according to one or more embodiments, and FIG. 4B illustrates a jumper connector arranged on an insulating surface of the PCB according to one or more embodiments.

As shown in FIGS. 3, 4A, and 4B, the control assembly 40 may include a PCB 110 where a plurality of circuit patterns 114 are formed, a plurality of circuit modules 120 arranged on the PCB 110, and a jumper connector 130 that electrically connects a plurality of non-connected circuit patterns 114.

The PCB 110 may include an insulating board 112 and the plurality of circuit patterns 114 printed on the insulating board 112. The insulating board 112 may be rigid or flexible. The insulating board 112 may include glass or plastic. For example, the insulating board 112 may include chemically tempered/semi-tempered glass, such as soda lime glass, aluminosilicate glass, or any other suitable glass known to one of ordinary skill in the art. In other examples, the insulating board 112 may include reinforced or flexible plastic, such as polyimide (PI), polyethylene terephthalate (PET), propylene glycol (PPG), or poly carbonate (PC), or any other suitable plastic known to one of ordinary skill in the art. In other examples, the insulating board 112 may include sapphire.

The plurality of circuit patterns 114 may be arranged on a first surface of the insulating board 112. In some examples, at least some of the plurality of circuit patterns 114 may not be connected to one another on the insulating board 112. The circuit pattern 114 may be an interconnection for transmitting an electrical signal, a heat sink pattern for transferring heat, or a shielding pattern for shielding a signal, and may be formed of a high-conductivity metal material.

The circuit pattern 114 may be formed of at least one metal material selected from among gold (Au), silver (Ag), platinum (Pt), titanium (Ti), tin (Sn), copper (Cu), and zinc (Zn). The circuit pattern 114 may be formed of a paste or a solder paste including at least one metal material selected from among Au, Ag, Pt, Ti, Sn, Cu, and Zn with excellent bonding strength. For example, the circuit pattern 114 may be formed of Cu that is highly electrically conductive and relatively inexpensive. The circuit pattern 114 may improve electrical conductivity or bonding strength by plating at least one material selected from among Au, Ag, Pt, Ni, and palladium (Pd) on metal (e.g., Cu) having high electrical conductivity.

The PCB 110 may be a single-side PCB in which the circuit pattern 114 is printed on one surface of the insulating board 112. The single-side PCB may improve the cost competitiveness of the display device because of being cheaper than a double-sided PCB in which the circuit pattern 114 is printed on both surfaces.

In the single-side PCB, a surface on which the circuit pattern 114 is printed may be referred to as a circuit surface S1, and a surface opposing the circuit surface S1 (e.g., a surface of the insulating board 112) may be referred to as an insulating surface S2. The circuit surface 51 may be arranged to face the rear cover 30 of the display device 1, and the insulating surface S2 may be arranged to face the chassis assembly 20 including the rear chassis 26.

Various holes may be arranged in the PCB 110. The jumper connector 130, a connector of the circuit module 120, may be arranged to pass through the holes.

The plurality of circuit modules 120 may be arranged on the circuit surface S1. Each of the circuit modules 120 may be a component of a control circuit that controls an operation of the display panel 10 or a component of a power source circuit that supplies power to the display panel 10.

Depending on the type of mounting on the PCB 110, the circuit module 120 may be classified into a surface-mount device (SMD), a single in-line package (SIP), a double in-line package (DIP), a quadruple in-line package (QIP), or any other suitable packing configuration known to one of ordinary skill in the art. While a first circuit module 122 of the SMD type and a second circuit module 124 and a third circuit module 126 of the DIP type are shown in FIG. 3, they are shown merely for convenience of description and the present disclosure is not limited thereto.

The first circuit module 122 of the SMD type may be mounted on the circuit surface S1, and a connector of the first circuit module 122 may be electrically connected to the circuit pattern 114. The connector of the first circuit module 122 may be fixed to the circuit pattern 114 via soldering material. The first circuit module 122 may be arranged to be led toward the rear cover 30 from the circuit surface S1.

The second circuit module 124 of the DIP type may be arranged to protrude directionally from the PCB 110 through a first hole h1 of the PCB 110. Among the holes of the PCB 110, a hole through which a circuit module passes will be referred to as the first hole h1. For example, the second circuit module 124 may be arranged to be led toward the rear cover 30 and the rear chassis 26 through the first hole h1. A connector of the second circuit module 124 may be electrically connected to the circuit pattern 114. The connector of the second circuit module 122 may be fixed to the circuit module 120 via soldering material.

The third circuit module 126 of the DIP type may be arranged to be led toward the rear cover 30 and the rear chassis 26 from the PCB 110 through the hole h10 of the PCB 110. The connector of the third circuit module 126 may be electrically connected to the circuit pattern 114 of the PCB 110.

For example, one end of the connector of the third circuit module 126 may be connected to the third circuit module 126 in a region of the third circuit module 126, led from the PCB 110 toward the rear chassis 26. The other end of the connector of the third circuit module 126 may be arranged to be led toward the rear cover 30 from the PCB 110 through a second hole h2 formed in the PCB 110. Among the holes of the PCB 110, a hole through which a connector of a circuit module passes will be referred to as the second holes h2a and h2b. The connector of the circuit module and the connector of the third circuit module 126 may be connected to the circuit pattern 114 via soldering material on the circuit surface S1 of the PCB 110.

The jumper connector 130 may electrically connect two points not connected among the circuit patterns 114 of the PCB 110. The jumper connector 130 may include a first protrusion portion 130a and a second protrusion portion 130b that protrude toward the rear cover 30 through the third holes h3a and h3b formed in the PCB 110 and a flat portion 130c that connects the first protrusion portion 130a to the second protrusion portion 130b and is arranged flat along the insulating surface S2 of the PCB 110. Among the holes of the PCB 110, a hole through which a protrusion portion of a jumper connector passes will be referred to as the third holes h3a and h3b.

A thickness t of the jumper connector 130, especially, a thickness of the flat portion 130c of the jumper connector 130 may be a reference for a separating distance between the PCB 110 and the rear chassis 26. The thickness t of the jumper connector 130 may be about 0.5 mm to about 1 mm, and the separating distance between the PCB 110 and the rear chassis 26 may be about 0.5 mm to about 1 mm.

The control assembly 40 may include the plurality of jumper connectors 130 in which the flat portion 130c of the jumper connector 130 may serve as a support member supporting the PCB 110 and as a spacer 152 forming a separating space between the PCB 110 and the rear chassis 26.

A height of a region protruding from the circuit surface S1 in the first protruding portion 130a and the second protruding portion 130b of the jumper connector 130 may be less than or equal to a protruding height of a circuit module. Thus, the height of the control assembly 40 may be considered as a sum of a thickness of the PCB 110, a thickness of a circuit module, and a thickness of the jumper connector 130. As described below, when the control assembly 40 includes a heat sink member, a thickness of the heat sink member may also be considered.

By arranging the control assembly 40 between the rear chassis 26 and the rear cover 30 such that the flat portion 130c of the jumper connector 130 is oriented toward the rear chassis 26 and the first protruding portion 130a and the second protruding portion 130b of the jumper connector 130, the circuit module 120, and the circuit surface S1 of the PCB 110 are oriented toward the rear cover 30, thereby reducing the height of the control assembly 40. Moreover, protruding portions of a sharp-end connector oriented toward a physically rigid rear cover result in a low possibility of damage to the rear cover by the protruding portion of the connector.

As described above, the rear chassis 26 may be formed of a material having high thermal conductivity. For example, as shown in FIG. 3, the rear chassis 26 may include a body 26a of a metal material having superior thermal conductivity and insulating paper 26b covering the surface of the body 26a. However, the present disclosure is not limited thereto. The rear chassis 26 may be formed of an insulating material having superior thermal conductivity.

Figure 5:
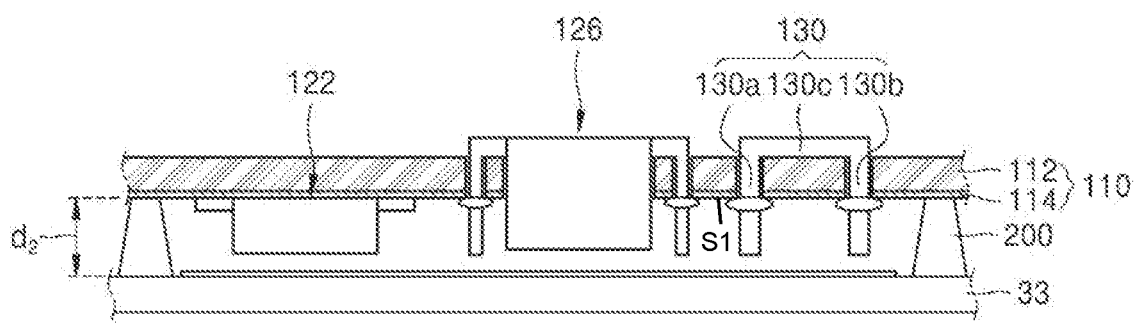
FIG. 5 illustrates, as a comparative example, a case where a circuit surface of a PCB is arranged toward a bottom chassis.

FIG. 5 shows, as a comparative example, a case where the circuit surface S1 of the PCB 110 is arranged toward the rear chassis 33. As shown in FIG. 5, when the circuit surface S1 of the PCB 110 is arranged toward the rear chassis 26, a distance d2 between the PCB 110 and the rear chassis 33 may be affected by the height of the circuit module 120 and the first protruding portion 130a and the second protruding portion 130b of the jumper connector 130. In particular, ends of the first protruding portion 130a and the second protruding portion 130b of the jumper connector 130 are relatively sharp and an area thereof is small, and thus the rear chassis 33 may be scratched. Thus, the PCB 110 and the rear chassis 33 may maintain a separating distance between the PCB 110 and the rear chassis 33 greater than the height of the jumper connector 130 protruding from the PCB 110.

However, as shown in FIG. 3, when the flat portion 130c of the jumper connector 130 is oriented toward the rear chassis 26, the flat portion 130c of the jumper connector 130 is smooth and thus an additional separating distance between the rear chassis 26 and the PCB 110 is not required (e.g., distance d2 in FIG. 5 may be eliminated for the configuration in FIG. 3). That is, compared to the configuration illustrated in FIG. 5, the flat portion 130c of the jumper connector 130 may be arranged to contact the rear chassis 26.

Moreover, even when the first protruding portion 130a and the second protruding portion 130b of the jumper connector 130 are arranged toward the rear cover 30, the rear cover 30 is formed of an insulating material such as plastic and thus, a thickness thereof is greater than the insulating paper 26b. Thus, even when the rear cover 30 is pressed by the jumper connector 130, major problems such as scratching are advantageously avoided.

The flat portion 130c of the jumper connector 130 may serve as the spacer 152 between the PCB 110 and the rear chassis 26, thereby reducing the total height of the control assembly 40.

To prevent the jumper connector 130 from leaving the third hole h3 of the PCB 110 in movement of the PCB 110 or soldering after insertion of the first protruding portion 130a and the second protruding portion 130b of the jumper connector 130 into the third hole h3 of the PCB 110, the jumper connector 130 may be bent.

The flat portion 130c of the jumper connector 130 may separate the distance between the PCB 110 and the rear chassis 26, and thus, may protrude from the PCB 110 to a specific height. For example, to apply a tensile force to the flat portion 130c of the jumper connector 130, the jumper connector 130 may be arranged on the PCB 110.

Figure 6:
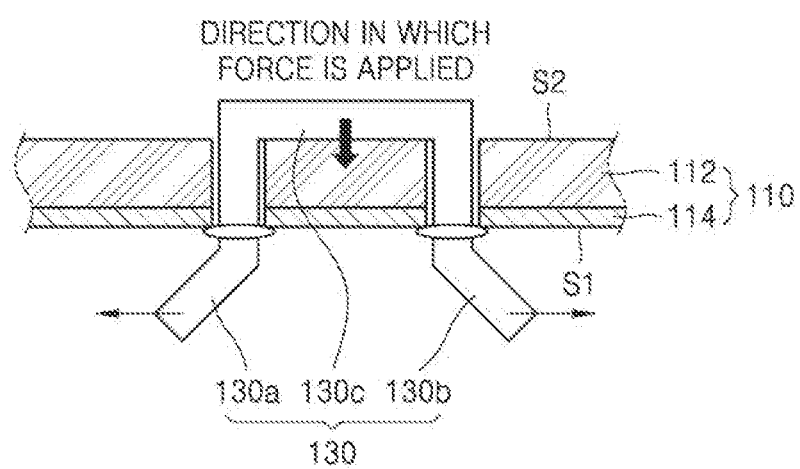
FIG. 6 illustrates a structure of a jumper connector to which a tensile force is applied, according to an embodiment.

FIG. 6 illustrates a structure of the jumper connector 130 to which a tensile force is applied, according to one or more embodiments. As shown in FIG. 6, after the jumper connector 130 is mounted on the PCB 110, the first protruding portion 130a and the second protruding portion 130b of the jumper connector 130 may be bent such that the tensile force acts on the flat portion 130c of the jumper connector 130.

For example, the flat portion 130c of the jumper connector 130 may be arranged on the insulating surface S2 of the PCB 110, and the first protruding portion 130a and the second protruding portion 130b of the jumper connector 130 may be arranged to protrude from the circuit surface S1 of the PCB 110 through the third holes h3a and h3b of the PCB 110.

By bending the first protruding portion 130a and the second protruding portion 130b of the jumper connector 130 in a direction opposite to the center of the jumper connector 130 (e.g., in an outward direction with respect to the flat portion 130c of the jumper connector 130), the tensile force may be applied to the flat portion 130c of the jumper connector 130. After the tensile force is applied, the flat portion 130c of the jumper connector 130 may closely contact the insulating surface S2 of the PCB 110, thereby reducing a protrusion error among the plurality of jumper connectors 130.

Figure 7:
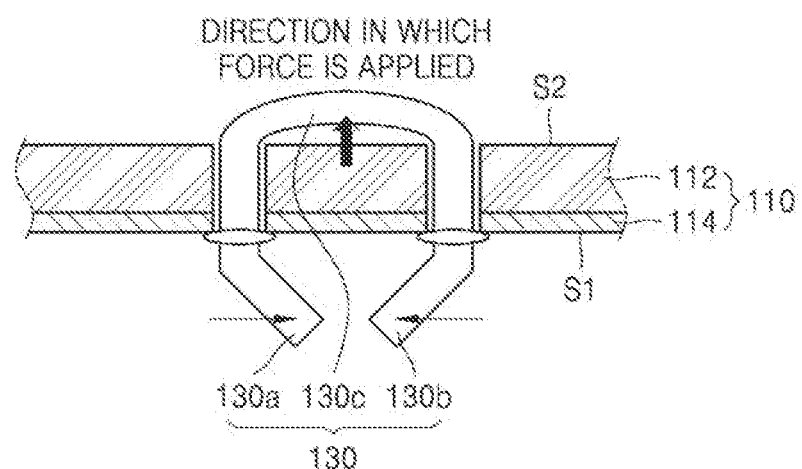
FIG. 7 illustrates, as a comparative example, a structure of a jumper connector to which a stress is applied.

FIG. 7 illustrates, as a comparative example, a structure of the jumper connector 130 to which a stress is applied. As shown in FIG. 7, the jumper connector 130 may be bent toward the center of the jumper connector 130 (e.g., toward the flat portion 130c of the jumper connector 130).

As such, by bending the first protruding portion 130a and the second protruding portion 130b of the jumper connector 130 toward each other, the stress may act on the flat portion 130c of the jumper connector 130 and thus, the flat portion 130c may rise away from the PCB 110. A rising shape of the jumper connector 130 may increase the protrusion error among the jumper connectors 130. This protrusion error may hinder the slimming of the display device, and the control assembly 40 may not be stably arranged on the rear chassis 26.

Figure 8:
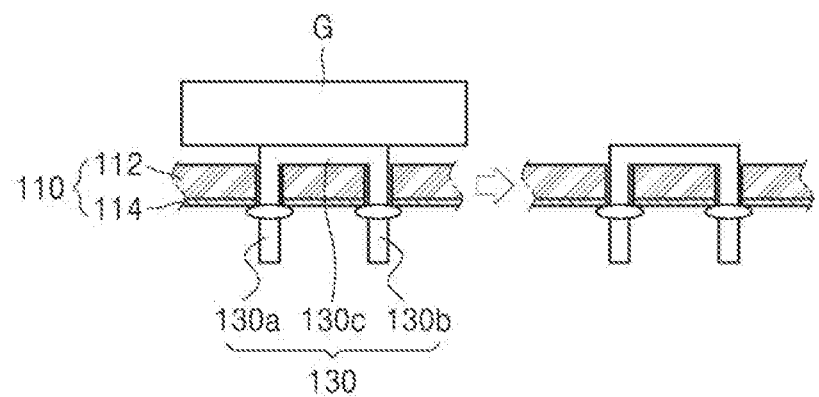
FIG. 8 illustrates a method of securing extrusion uniformity of a jumper connector, according to another embodiment.

FIG. 8 illustrates a method of securing extrusion uniformity of the jumper connector 130, according to one or more embodiments. As shown in FIG. 8, to solder the jumper connector 130 to the PCB 110, a pressing jig G may be used. As the pressing jig G presses the flat portion 130c of the jumper connector 130 during the soldering of the jumper connector 130, the flat portion 130c of the jumper connector 130 may maintain a specific height without lifting from the PCB 110 during the soldering.

Although the jumper connector 130 is shown in the drawing, the present disclosure is not limited thereto. In the soldering, the circuit modules 120 may also be pressed using the pressing jig G. As a result of using the pressing jig G, the protruding height of the jumper connector 130 and the protruding height of the circuit module 120 from the PCB 110 may also become uniform.

Figure 9:
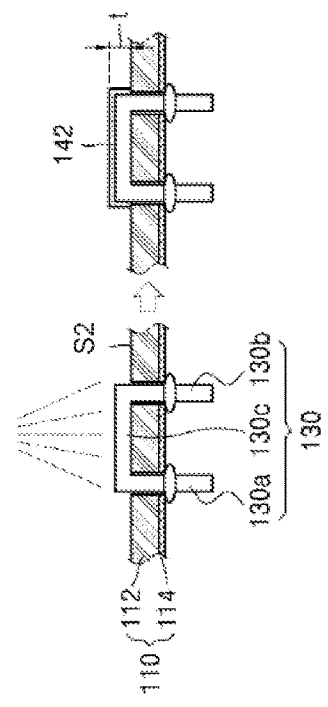
FIG. 9 is a view for describing a method of securing extrusion uniformity according to another embodiment.

FIG. 9 is a view for describing a method of securing extrusion uniformity according to one or more embodiments. A mechanical error may occur in the bending of the jumper connector 130, and the jumper connector 130 may rise away from the PCB 110 by heat in the soldering of the jumper connector 130. The control assembly 40, according to one or more embodiments, may spray an adhesive material on the flat portion 130c of the jumper connector 130 before the soldering of the jumper connector 130. Thus, the flat portion 130c of the jumper connector 130 may be adhered to the insulating surface S2 of the PCB 110 by the adhesive layer 142.

An adhesive layer 142 may fix the flat portion 130c of the jumper connector 130 to the insulating surface S2 of the PCB 110, thereby preventing the flat portion 130c of the jumper connector 130 from lifting in the soldering. Moreover, the protruding height of the jumper connector 130 from the insulating surface S2 of the PCB 110 may also become uniform.

Although the jumper connector 130 is shown in the drawing, the present disclosure is not limited thereto. Before the soldering, the adhesive may also be sprayed to the circuit module 120. Thus, the circuit module 120 may also be fixed to the PCB 110 by the adhesive layer 142.

Figure 10:
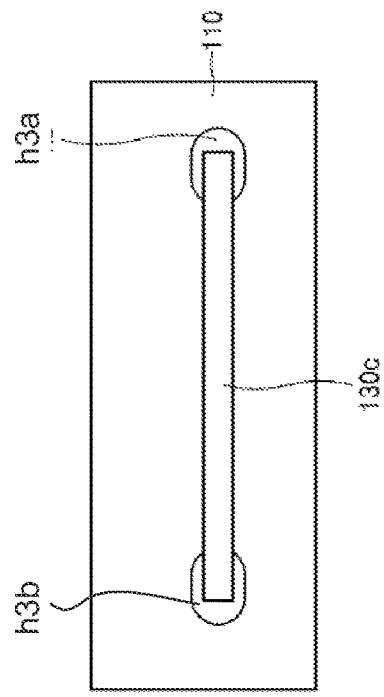
FIG. 10 illustrates a shape of a hole of a PCB according to an embodiment.

FIG. 10 illustrates a shape of third holes h3a and h3b of a PCB according to one or more embodiments. As shown in FIG. 10, a cross section of the third holes h3a and h3b formed in the PCB 110 may have an oval shape. The jumper connector may pass through the third holes h3a and h3b of the PCB 110.

The jumper connector 130 may be bent to pass through the first hole h1, and when the third hole h3 has a circular shape, the jumper connector 130 may be bent such that a portion of the jumper connector 130 may be recessed into the third holes h3a and h3b.

The third holes h3a and h3b of the PCB 110, according to one or more embodiments, may have an oval shape, and a major-axis length of the third holes h3a and h3b may be parallel to a longitudinal direction of the flat portion 130c of the jumper connector 130. Thus, even when the jumper connector 130 is bent, a space of the third holes h3a and h3b in a direction parallel to the bent direction is large, thereby preventing the jumper connector 130 from being recessed.

While the cross section of the third holes h3a and h3b through which the jumper connector passes is an oval in FIG. 10, the present disclosure is not limited thereto. A cross section of the second holes h2a and h2b through which the connector of the circuit module passes may be an oval. The connector of the circuit module may need to be bent to pass through the second holes h2a and h2b such that the major-axis length of the second holes h2a and h2b may be parallel to a direction in which the connector of the circuit module is connected in the circuit module.

Figure 11:
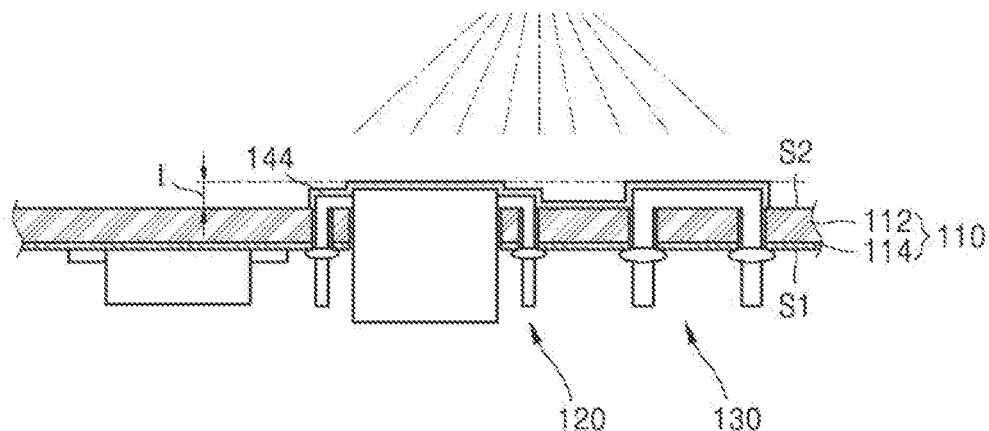
FIG. 11 illustrates an example where a first protection layer is applied onto surfaces of a jumper connector and a circuit module, according to an embodiment.

FIG. 11 illustrates, in accordance with one or more examples, where a first protection layer is applied onto surfaces of a jumper connector and a circuit module, according to one or more embodiments.

As described above, the jumper connector 130 and the circuit module 120 of the control assembly 40, according to one or more embodiments, may directly contact the insulating paper 26b of the rear chassis 26. To alleviate the scratch of the insulating paper 26c, a first protection layer 144 for alleviating surface roughness may be further coated on the surfaces of the jumper connector 130 and the circuit module 120.

As shown in FIG. 11, the first protection layer 144 may be arranged to cover the flat portion 130c of the jumper connector 130 on the insulating surface S1 of the PCB 110. While it is shown in FIG. 11 that the first protection layer 144 covers the flat portion 130c of the jumper connector 130 and the circuit module 120, the present disclosure is not limited thereto. In other examples, the first protection layer 144 may cover the entire insulating surface S2 of the PCB 110. The first protection layer 144 may include a moisture-proof insulating coating material with a low surface roughness.

Figure 12:
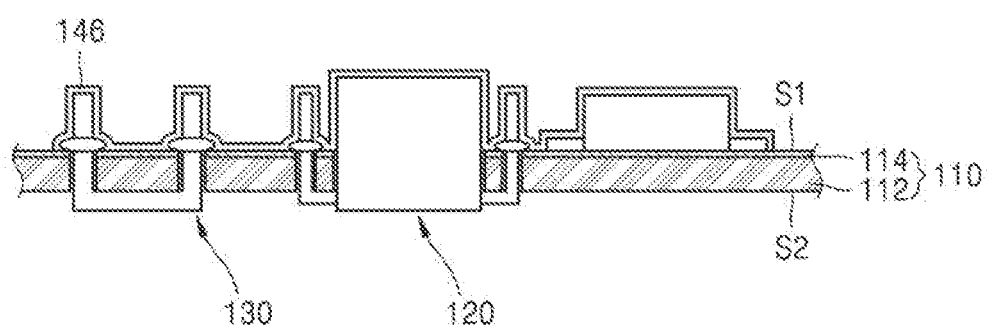
FIG. 12 illustrates a control assembly including a second protection layer according to another embodiment.

FIG. 12 illustrates a control assembly including a second protection layer, according to one or more embodiments. The control assembly 40 may be weak due to humidity, etc., because the circuit pattern 144 and the circuit module 120 of the PCB 110 may be exposed toward the rear cover 30. Thus, as shown in FIG. 12, the control assembly 40 may further include a second protection layer 146 that covers the circuit module 120 and the jumper connector 130 on the circuit surface S1 of the PCB 110. The second protection layer 146 may be formed by spraying, for example, a component protection material such as moisture-proof oil.

Figure 13:
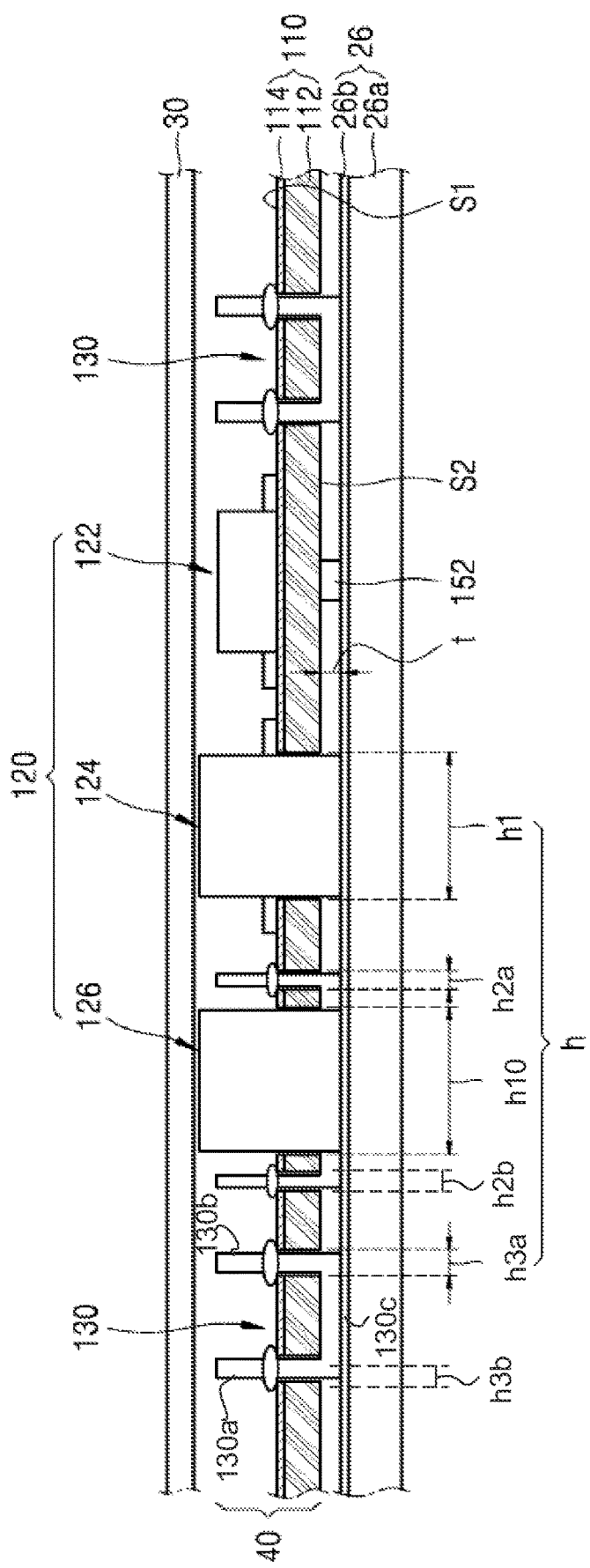
FIG. 13 illustrates a control assembly further including a spacer according to an embodiment.

FIG. 13 illustrates a control assembly further including a spacer according to one or more embodiments. Comparing FIG. 3 with FIG. 13, the control assembly 40 may further include the spacer 152 supporting the PCB 110. Even when the flat portion 130c of the jumper connector 130 supports the PCB 110, the jumper connector 130 may be arranged in a specific region of the PCB 110. Thus, a force directed from the PCB 110 to the rear chassis 26 may not be uniform.

The spacer 152 may be arranged in a region where the jumper connector 130 is not arranged on a space of the PCB 110 and the rear chassis 26. The spacer 152 may advantageously prevent the PCB 110 from being bent. The spacer 152 may be arranged on the insulating surface S2 of the PCB 110 or on the rear chassis 26.

The thickness of the spacer 152 may be equal to the thickness t of the jumper connector 130. However, the present disclosure is not limited thereto. When the spacer 152 is formed of an elastic material such as polymer, the spacer 152 may be slightly greater than the thickness t of the jumper connector 130. Thus, when the PCB 110 is mounted on the rear chassis 26, the thickness of the spacer 152 may become equal to the thickness t of the jumper connector 130. In some examples, when referring to 'the thicknesses are equal' or 'the protruding heights are equal', the terms may mean not only that they are numerically exactly equal, but also that they have an error range of 10% or less.

Figure 14:
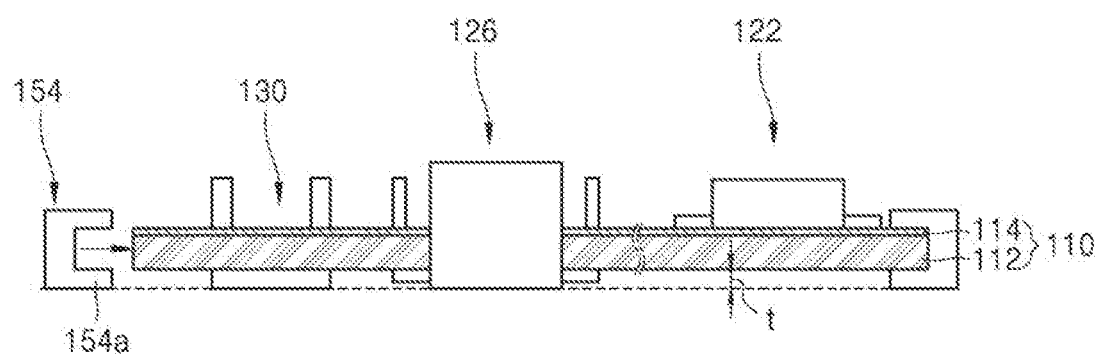
FIG. 14 illustrates a control assembly including a holder-type spacer according to an embodiment.

FIG. 14 illustrates a control assembly including a holder-type spacer according to one or more embodiments. As shown in FIG. 14, the control assembly 40 may further include a spacer 154 of a holder type. The spacer 154 may be positioned on an edge of the PCB 110 such that the spacer 154 grips the edge of the PCB 110. As the size of the PCB 110 increases, the PCB 110 may be bent, such that the spacer 154 may disperse the force applied to the PCB 110. A thickness of a region 154a arranged between the PCB 110 and the rear chassis 26 in the spacer 154 may be equal to the thickness t of the jumper connector 130.

Figure 15:
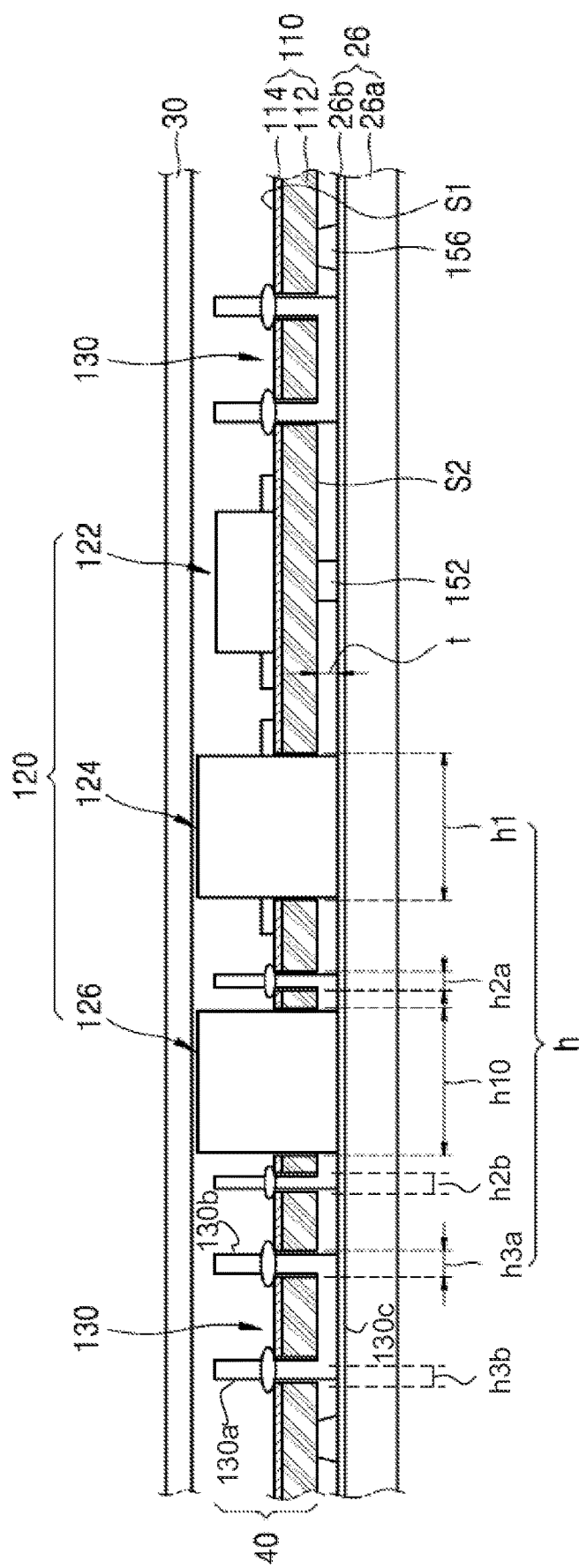
FIG. 15 illustrates a bottom chassis having a spacer formed integrally according to an embodiment.

FIG. 15 illustrates the rear chassis 26 having a spacer 156 formed integrally on the rear chassis 26, according to one or more embodiments. As shown in FIG. 15, the spacer 156 supporting the PCB 110 may be formed integrally on the rear chassis 26. When the spacer 156 is formed on the rear chassis 26, the spacer 154 of a holder type shown in FIG. 15 may be omitted.

The rear chassis 26 may be formed of a material with a good heat sink property to dissipate heat generated in the display panel 10 outside. The spacer 156 may be formed of the same material as the rear chassis 26 and contact the insulating surface S2 of the PCB 110, thereby performing an advantageous heat dissipation function of dissipating heat generated in the control assembly 40 to an external environment (e.g., environment outside of display device 1).

According to some embodiments, the thickness of the spacer 156 may be equal to the thickness t of the jumper connector 130. The rear chassis 26 may include the body 26a and the insulating paper 26b, and when the spacer 156 is integrated with the body 26a, the thickness of the spacer 156 may be less than the thickness t of the jumper connector 130, but a difference there between may be small.

FIG. 16 illustrates a plurality of control assemblies according to one or more embodiments. As shown in FIG. 16, the control assembly 40 may include a plurality of control assemblies 40a and 40b. For example, the control assembly 40 may include a first control assembly 40a including a control circuit and a second control assembly 40b including a power source circuit. Each of the first control assembly 40a and the second control assembly 40b may include a PCB, a circuit module, and a jumper connector arranged on the PCB.

The control assembly 40 includes the plurality of control assemblies, thus dispersing the force applied to the PCB and making it easy to repair the control assembly 40.

While it is shown in the drawing that both the first control assembly 40a and the second control assembly 40b include a single-side PCB and a jumper connector, the present disclosure is not limited thereto. Any one of the first control assembly 40a and the second control assembly 40b may include a double-side PCB.

Figure 17A:
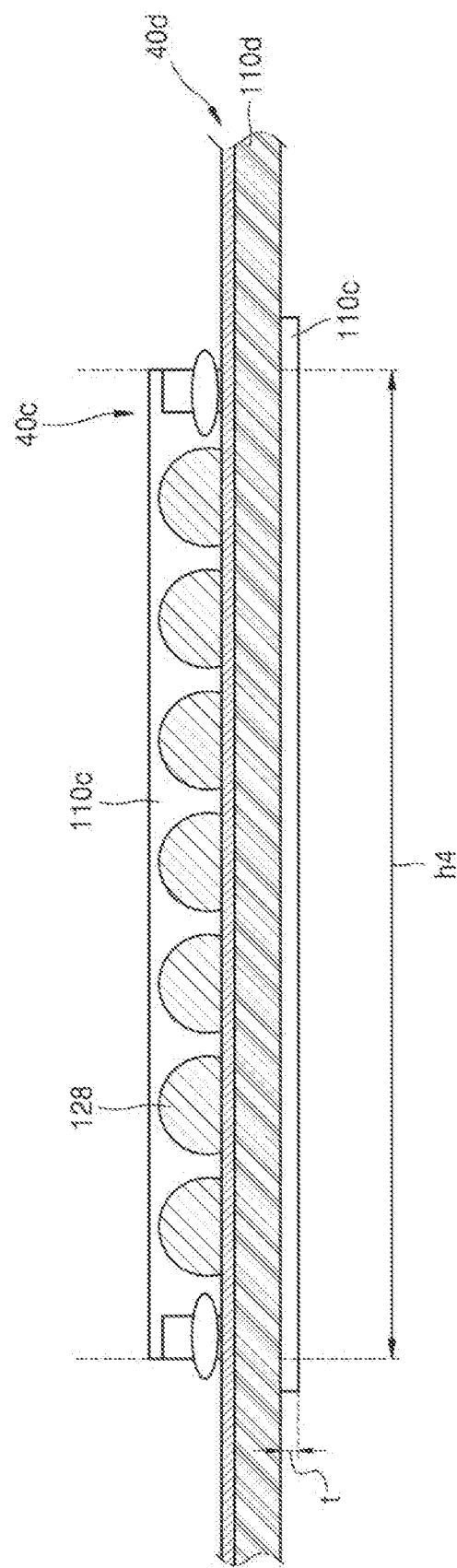
FIG. 17A is a plane view of a plurality of control assemblies according to another embodiment.
Figure 17B:
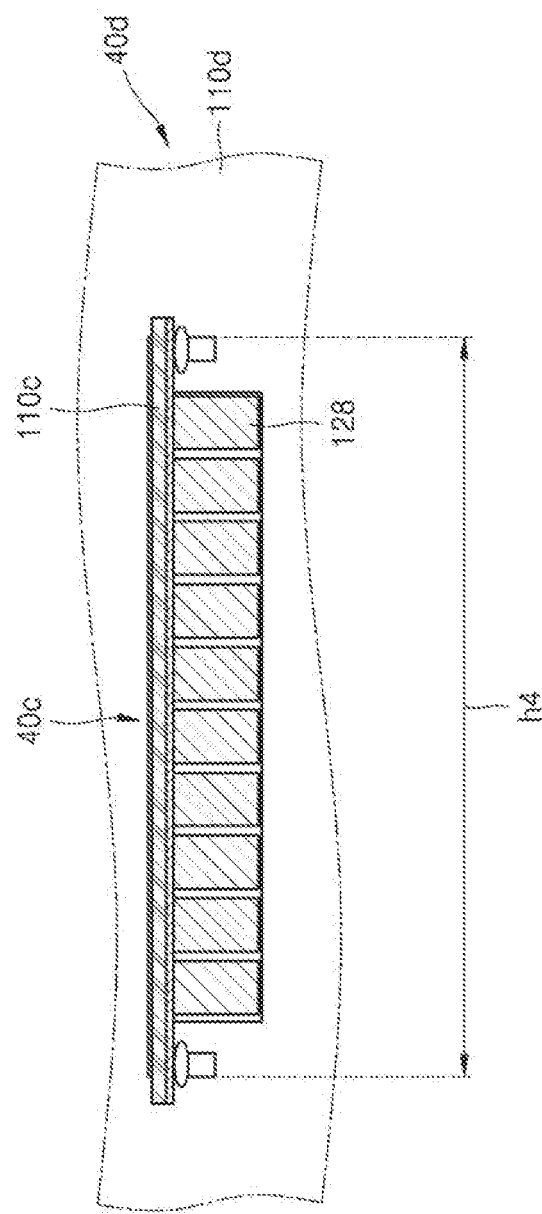
FIG. 17B is a cross-sectional view of a control assembly of FIG. 17A.

FIG. 17A is a plane view of a plurality of control assemblies according to one or more embodiments, and FIG. 17B is a cross-sectional view of the control assembly of FIG. 17A. As shown in FIGS. 17A and 17B, a third control assembly 40c may be arranged in a fourth hole h4 of a fourth control assembly 40d. Herein, a hole through which another PCB passes among the holes formed in the PCB may be referred to as the fourth hole h4.

For example, the third control assembly 40c may include a third PCB 110c and a fourth circuit module 128 mounted on the third PCB 110c (e.g., a capacitor), and the fourth control assembly 40d may include a fourth PCB 110d and a circuit module. The fourth circuit module 128 may be mounted as an SMD type on the third PCB 110c. The fourth control assembly 40d may include a single-side PCB 110d, a circuit module, and a jumper connector.

The third control assembly 40c may pass through the fourth hole h4 of the fourth control assembly 40d such that the third PCB 110c of the third control assembly 40c and the fourth PCB 110d of the fourth control assembly 40d may be arranged and fixed perpendicularly to each other.

According to some embodiments, the third PCB 110c may be arranged to protrude from the insulating surface S2 of the fourth PCB 110d to the thickness t of the jumper connector 130 (e.g., the thickness of the flat portion 130c). The third PCB 110c may serve as a spacer between the fourth PCB 110d and the rear chassis 26.

In the control assembly 40, heat may be generated due to use of power in the display device 1. To dissipate the generated heat outside, the control assembly 40 may further include a heat sink member.

Figure 18:
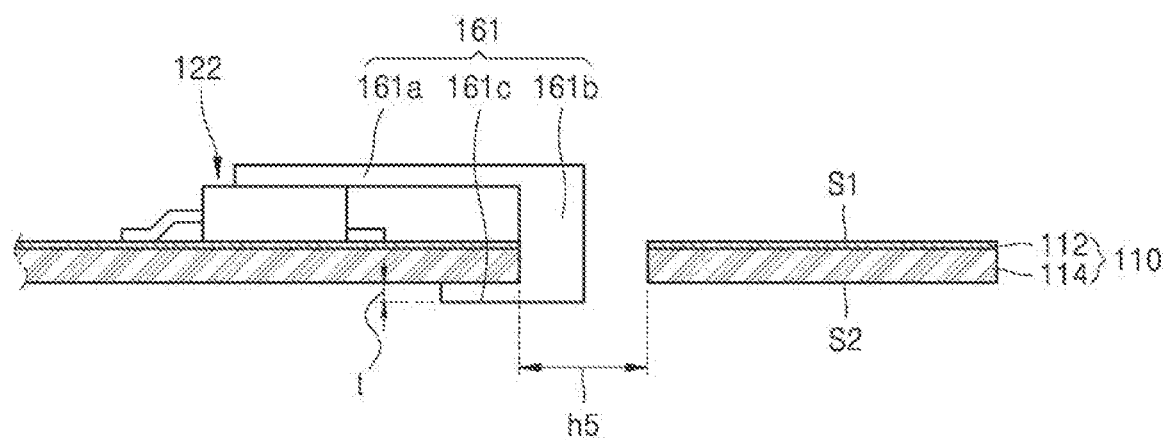
FIG. 18 illustrates a control assembly including a heat sink member according to an embodiment.

FIG. 18 illustrates a control assembly including a heat sink member according to one or more embodiments. A heat sink member 161 according to one or more embodiments may not only dissipate heat generated in the control assembly 40, but also serve as the spacer 152 that separates the PCB 110 from the rear chassis 26.

As shown in FIG. 18, the heat sink member 161, according to one or more embodiments, may include a region bent at least twice. A first region 161a of the heat sink member 161 may contact the circuit module 122, and a second region 161b connected to the first region 161a may pass through a fifth hole h5 of the PCB 110. Among the holes of the PCB 110, a hole through which the heat sink member passes may be referred to as the fifth hole h5.

A third region 161c of the heat sink member 161 may contact the insulating surface S2 of the PCB 110 while contacting the second region 161b. The first region 161a of the heat sink member 161 may cover the top surface of the circuit module 122. Thus, the heat sink member 161 may not only dissipate heat of the circuit module 122 to an external environment, but also protect the circuit module 122 by covering the top surface of the circuit module 122.

The thickness of the third region 161c of the heat sink member 161 may be equal to the thickness of the jumper connector 130. The heat sink member 161 may separate the PCB 110 from the rear chassis 26 as well as fix the circuit module 122 to the PCB 110. The heat sink member 161 may dissipate heat generated in the circuit module 122 outside through the rear chassis 26.

Figure 19:
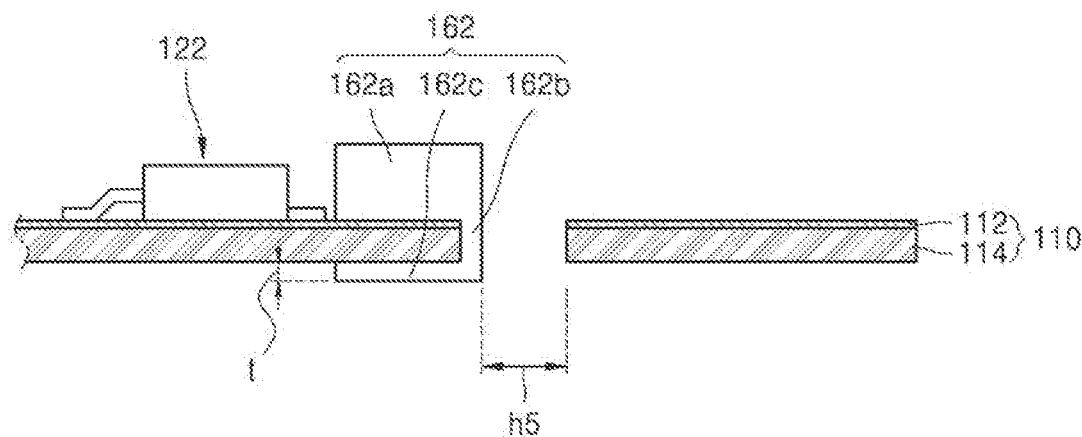
FIG. 19 illustrates a heat sink member according to another embodiment.

FIG. 19 illustrates a heat sink member 162 according to one or more embodiments. As shown in FIG. 19, the heat sink member 162 may contact the circuit pattern 114 rather than the circuit module 122. For example, the heat sink member 162 may include a first region 162a contacting the circuit pattern 114, a second region 162b connected to the first region 162a and passing through the fifth hole h5 of the PCB 110, and a third region 162c connected to the second region 162b and contacting the insulating surface S2 of the PCB 110.

The thickness of the third region 162c of the heat sink member 162 may be equal to the thickness of the jumper connector 130. Thus, the heat sink member 162 may dissipate the heat generated in the circuit pattern 114 outside through the rear chassis 26 while separating the PCB 110 from the rear chassis 26.

Figure 20:
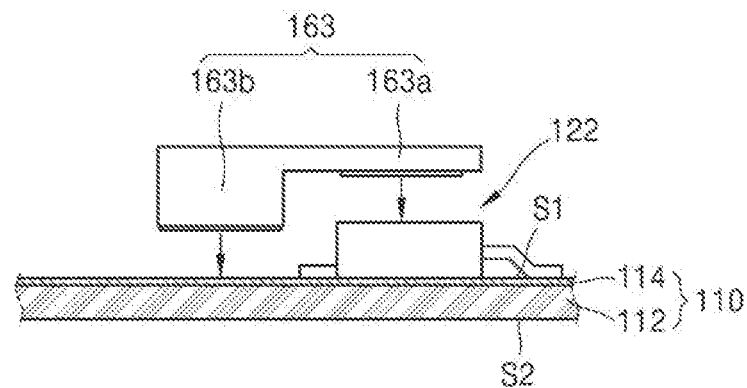
FIG. 20 illustrates a heat sink member according to another embodiment.

FIG. 20 illustrates a heat sink member 163 according to one or more embodiments. As shown in FIG. 20, the heat sink member 163 may contact both the circuit pattern 114 and the circuit module 122. For example, the heat sink member 163 may include a first region 163a contacting the circuit pattern 114 and a second region 163b contacting the circuit module 120. The heat sink member 163 may contact the circuit pattern 114 and the circuit module 122 through an adhesive layer.

Figure 21:
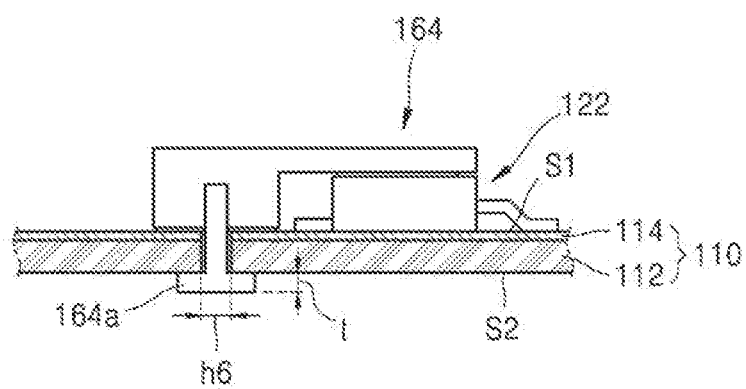
FIG. 21 illustrates a heat sink member fixed through a coupling member according to an embodiment.

FIG. 21 illustrates a heat sink member 164 fixed through a coupling member 164a, according to one or more embodiments. As shown in FIG. 21, the heat sink member 164 may be fixed through a coupling member 164a. Like the heat sink member 164, the coupling member 164a may also be formed of a material having a good heat sink property. The coupling member 164a may be a screw, and the heat sink member 164 may have formed therein a groove with which the coupling member 164a is engaged. The coupling member 164a may be inserted into the groove of the heat sink member 165 through a sixth hole h6 of the PCB 110 on the insulating surface S2 of the PCB 110, thereby fixing the heat sink member 164 to the PCB 110. Among the holes of the PCB 110, a hole through which a connection member of a heat sink member passes may be referred to as the sixth hole h6.

A head thickness of the coupling member 164a may be less than or equal to the thickness t of the jumper connector 130. When the head thickness of the coupling member 164a is similar to the thickness t of the jumper connector 130, the head of the coupling member 164a may not only contact the rear chassis 26 to separate the rear chassis 26 from the PCB 110, but also connect the heat sink member 161 with the rear chassis 26, thereby further advantageously improving a heat sink effect.

Figure 22:
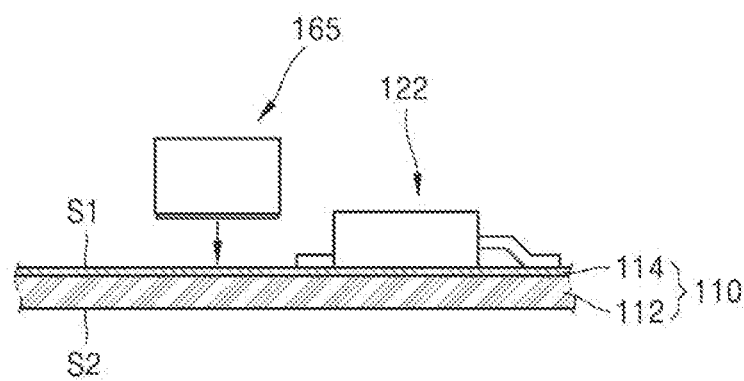
FIG. 22 illustrates a heat sink member in another form.

FIG. 22 illustrates a heat sink member, according to one or more other examples. As shown in FIG. 22, a heat sink member 165 may be arranged to contact the circuit pattern 114 of the PCB 110. The thickness of the heat sink member 165 (e.g., the height of the heat sink member 165 protruding from the circuit pattern 114) may be equal to or greater than the thickness of the circuit module 122. Thus, the heat sink member 165 may prevent the circuit module 122 from being damaged by an external factor such as the rear cover 30, for example.

Figure 23:
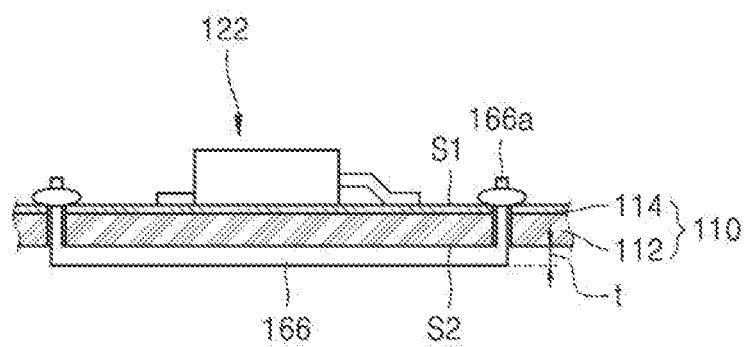
FIG. 23 illustrates a heat sink member in another form.

FIG. 23 illustrates a heat sink member, according to one or more other examples. As shown in FIG. 23, a heat sink member 166 may be of a plate type arranged on the insulating surface S2 of the PCB 110. In a region of the heat sink member 166, a connection member 166a led toward the circuit surface S1 of the PCB 110 through the sixth hole h6 of the PCB 110, for example, a pin may be arranged. The connection member 166a may be fixed to the circuit surface S1 of the PCB 110 through soldering. The heat sink member 167 may be arranged on the insulating surface S2 of the PCB 110 to overlap the circuit module 122.

The thickness of the heat sink member 166 may be equal to or substantially similar to the thickness t of the jumper connector 130. Thus, the heat sink member 166 may separate the PCB 110 from the rear chassis 26. Moreover, the heat sink member 166 may directly contact the PCB 110 and the rear chassis 26 such that heat generated in the circuit module 122 or heat generated in the circuit pattern 114 may be sequentially delivered to the insulating board 112, the heat sink member 166, and the rear chassis 26.

Figure 24:
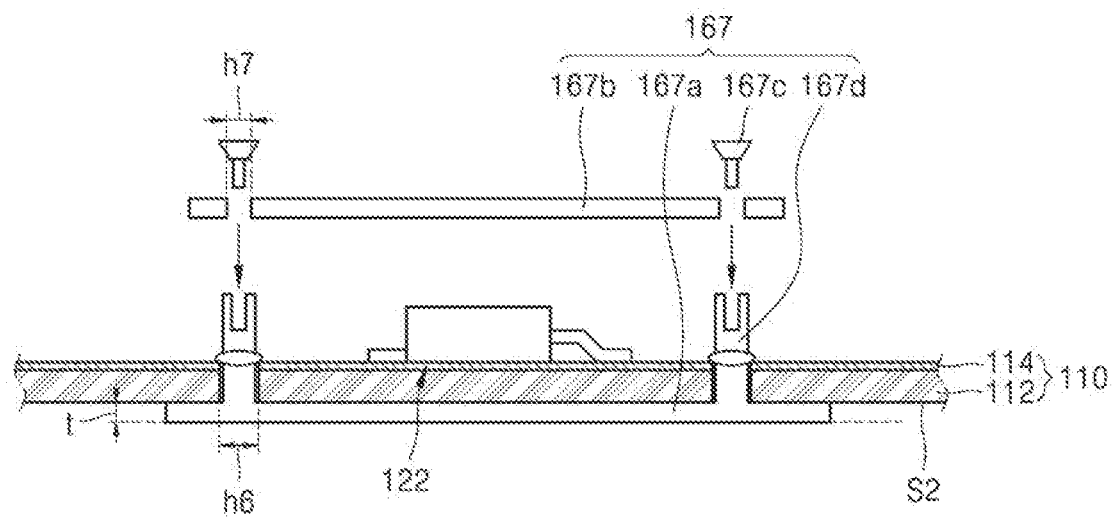
FIG. 24 illustrates a heat sink member including a heat sink cover, according to an embodiment.

FIG. 24 illustrates a heat sink member including a heat sink cover, according to one or more embodiments. As shown in FIG. 24, a heat sink member 167 may include a heat sink plate 167a arranged on the insulating surface S2 of the PCB 110, a heat sink cover 167b covering the circuit module 120, and coupling members 167c and 167d connecting the heat sink plate 167a to the heat sink cover 167b.

The heat sink plate 167a may be arranged on the insulating surface S2 of the PCB 110 to overlap the circuit module 122. The thickness of the heat sink plate 167a may be equal to or substantially similar to the thickness t of the jumper connector 130. Thus, the heat sink plate 167a may separate the PCB 110 from the rear chassis 26.

The heat sink cover 167b may be arranged to cover the circuit module 122. The heat sink cover 167b may deliver the heat generated in the circuit module 122 and protect the circuit module 122 and the circuit pattern 114.

The coupling members 167c and 167d may be connected to the heat sink plate 167a, and include a first coupling member 167c that protrudes toward the circuit surface S1 of the PCB 110 through the sixth hole h6 of the PCB 110 and a second coupling member 167d that is coupled to the first coupling member 167c through a seventh hole h7. The first coupling member 167c may have a groove formed therein, and the second coupling member 167d may be a screw.

Figure 25:
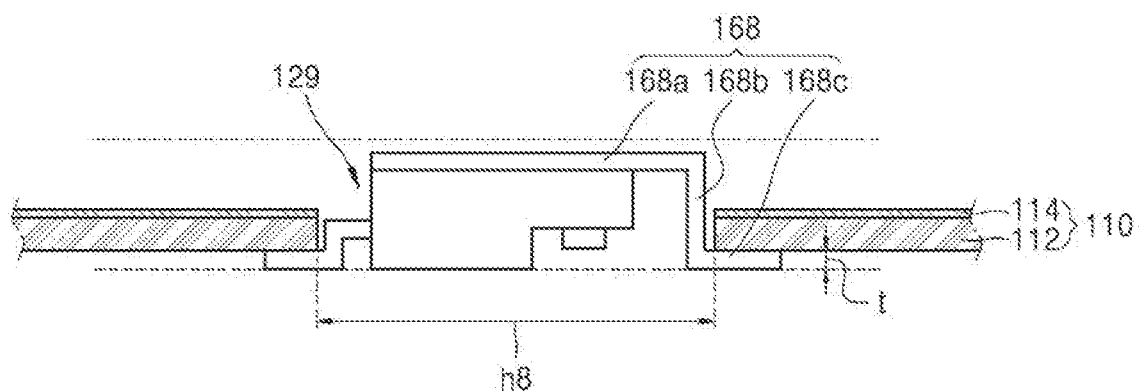
FIG. 25 illustrates a heat sink member applicable to a circuit module of a single in-line package (SIP) type according to an embodiment.

FIG. 25 illustrates a heat sink member applicable to a circuit module of an SIP type according to one or more embodiments. As shown in FIG. 25, a circuit module 129 may be arranged through an eighth hole h8 of the PCB 110, and a connector 129c of the circuit module 129 may be electrically connected to the circuit pattern 114 of the PCB 110. Among the holes of the PCB 110, a hole through which at least two of the connector of the circuit module and the heat sink member pass may be referred to as the eighth hole h8.

The connector 129c of the circuit module 129 shown in FIG. 25 may be arranged and fixed to protrude toward the circuit surface S1 of the PCB 110 through the seventh hole h7 of the PCB 110.

Another surface of the circuit module 129 may be fixed to the PCB 110 by a heat sink member 168. The heat sink member 168 may include a first region 168a covering the circuit module 129, a second region 168b connected to the first region 168a and passing through the eighth hole h8 of the PCB 110, and a third region 168c connected to the second region 168b and contacting the insulating surface S2 of the PCB 110.

The thickness of the connector of the circuit module 129, the protruding height of the circuit module 129, and the thickness of the third region 168c of the heat sink member 168 may be equal to the thickness t of the jumper connector 130. Thus, the connector 129c of the circuit module 129 and the third region 168c of the heat sink member 168, which protrude from the insulating surface S2 of the PCB 110 toward the rear chassis 26, may separate the PCB 110 from the rear chassis 26. However, the present disclosure is not limited thereto. At least one of the thickness of the connector of the circuit module 129, the protruding height of the circuit module 129, and the thickness of the third region 168c of the heat sink member 168 may be less than the thickness t of the jumper connector 130.

Figure 26:
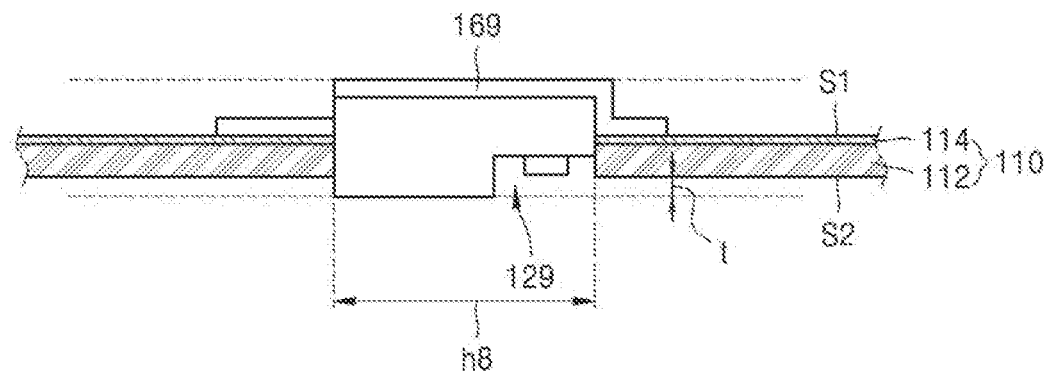
FIG. 26 illustrates a relationship between another circuit module and a heat sink member according to another embodiment.

FIG. 26 illustrates a relationship between another circuit module 129 and a heat sink member 169, according to one or more embodiments. As shown in FIG. 26, the circuit module 129 may be arranged through the eighth hole h8 of the PCB 110, and the connector 129c of the circuit module 129 may be electrically connected to the circuit pattern 114 of the PCB 110.

The heat sink member 169 may include a first region 169a contacting the circuit module 120 and a second region 169b contacting the circuit surface S1 of the PCB 110. As a result of this advantageous configuration, none of the connector 129c of the circuit module 129 and the heat sink member 169 may protrude toward the insulating surface S2 of the PCB 110.

A partial region of the circuit module 129 may protrude from the insulating surface S2 of the PCB 110. The protruding height of the circuit module 129 may be equal to the thickness t of the jumper connector 130. Thus, the circuit module 129, together with the jumper connector 130, may serve as a spacer.

Components of the control assembly 40, for example, the jumper connector 130, the heat sink member 161, the circuit module 120, the connector of the circuit module 120, etc., may serve as spacers that separate the PCB 110 from the rear chassis 26, thereby dispersing a force in spite of a large size of the PCB 110, and thus, preventing the PCB 110 from being bent.

Although example embodiments have been described and shown in the accompanying drawings to facilitate the understanding of the present disclosure, it should be understood that these embodiments are merely illustrative of the present disclosure and do not limit the present disclosure. It should be understood that the present disclosure is not limited to the illustration and description. This is because various other modifications may occur to those of ordinary skill in the art.

What is claimed is:

1. A display device comprising:
a display panel configured to display an image;
a chassis assembly accommodating the display panel;
a rear cover surrounding at least a portion of the chassis assembly; and
a power source assembly provided between the chassis assembly and the rear cover, the power source assembly being configured to supply power to the display panel,
wherein the power source assembly comprises:
a single-side printed circuit board (PCB) comprising a circuit surface facing the rear cover with a circuit pattern printed thereon, and an insulating surface facing the chassis assembly, and
a circuit module comprising a first circuit module arranged on the circuit surface of the single-side PCB, and a second circuit module arranged on the circuit surface of the single-side PCB and passing through a first hole of the single-side PCB such that the second circuit module extends to a side of the single-side PCB that is opposite to the circuit surface,
wherein the power source assembly further comprises a jumper connector electrically connecting two points of the circuit pattern on the circuit surface, the jumper connector comprising a region provided on the insulating surface of the single-side PCB, and
wherein a protruding height of the jumper connector from the circuit surface is less than or equal to a protruding height of the second circuit module from the circuit surface.

2. The display device of claim 1, wherein the jumper connector comprises:
a first protruding portion passing through a second hole of the single-side PCB and electrically connected to the circuit pattern;
a second protruding portion passing through a third hole of the single-side PCB and electrically connected to the circuit pattern; and
a flat portion provided on the insulating surface and connected to the first protruding portion and the second protruding portion, and
wherein the flat portion of the jumper connector contacts the chassis assembly.

3. The display device of claim 2, wherein the first protruding portion and the second protruding portion are configured to apply a tensile force to the flat portion of the jumper connector.

4. The display device of claim 2, wherein the first protruding portion and the second protruding portion are bent outward from the flat portion of the jumper connector.

5. The display device of claim 2, wherein at least one of the second hole or the third hole has an oval cross-section.

6. The display device of claim 5, wherein a major-axis direction of the oval cross-section is parallel to a longitudinal direction of the flat portion of the jumper connector.

7. The display device of claim 1, wherein a separating distance between the insulating surface of the single-side PCB and the chassis assembly is less than or equal to about 1 mm.

8. The display device of claim 1, further comprising a spacer supporting the single-side PCB in contact with at least one of the single-side PCB or the chassis assembly.

9. The display device of claim 8, wherein the spacer comprises an elastic material.

10. The display device of claim 1, further comprising a heat sink member contacting at least one of the single-side PCB or the circuit module.

11. The display device of claim 10, wherein the heat sink member comprises a first region protruding from the insulating surface toward the chassis assembly through a second hole of the single-side PCB.

12. The display device of claim 1, further comprising a holder-type spacer provided in an edge of the single-side PCB and configured to prevent the single-side PCB from being bent.

13. The display device of claim 1, further comprising a sub power source assembly passing through a second hole of the single-side PCB,
wherein the chassis assembly comprises a rear chassis, and
wherein a height of a region of the sub power source assembly protruding from the single-side PCB toward the rear chassis is equal to a thickness of the jumper connector.

14. The display device of claim 1, wherein a protruding height of the second circuit module towards the rear cover is greater than a protruding height of the first circuit module towards the rear cover.

* * * * *